(12) United States Patent
Chang et al.

(10) Patent No.: US 11,322,618 B2
(45) Date of Patent: *May 3, 2022

(54) SEMICONDUCTOR DEVICE AND MANUFACTURING METHOD THEREOF

(71) Applicant: Taiwan Semiconductor Manufacturing Co., Ltd., Hsinchu (TW)

(72) Inventors: Che-Cheng Chang, New Taipei (TW); Chih-Han Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 24 days.

This patent is subject to a terminal disclaimer.

(21) Appl. No.: 16/682,327

(22) Filed: Nov. 13, 2019

(65) Prior Publication Data

US 2020/0083378 A1 Mar. 12, 2020

Related U.S. Application Data

(63) Continuation of application No. 16/226,875, filed on Dec. 20, 2018, now Pat. No. 10,510,897, which is a (Continued)

(51) Int. Cl.
*H01L 29/66* (2006.01)
*H01L 29/06* (2006.01)
(Continued)

(52) U.S. Cl.
CPC .... *H01L 29/7851* (2013.01); *H01L 21/31144* (2013.01); *H01L 29/0649* (2013.01); *H01L 29/511* (2013.01); *H01L 29/517* (2013.01); *H01L 29/518* (2013.01); *H01L 29/6656* (2013.01); *H01L 29/66545* (2013.01); *H01L 29/66795* (2013.01); *H01L 29/785* (2013.01)

(58) Field of Classification Search
CPC ........... H01L 29/66545; H01L 29/0649; H01L 29/517; H01L 29/518; H01L 29/6656
See application file for complete search history.

(56) References Cited

U.S. PATENT DOCUMENTS 9,112,032 B1 8/2015 Liu et al.
10,164,113 B2 * 12/2018 Chang ............... H01L 29/66545
(Continued)

FOREIGN PATENT DOCUMENTS

CN 103219340 A 7/2013
CN 104934377 A 9/2015

*Primary Examiner* — Fernando L Toledo
*Assistant Examiner* — Valerie N Newton
(74) *Attorney, Agent, or Firm* — Slater Matsil, LLP

(57) ABSTRACT

A semiconductor device includes a substrate, at least two gate spacers, and a gate stack. The substrate has at least one semiconductor fin. The gate spacers are disposed on the substrate. At least one of the gate spacers has a sidewall facing to another of the gate spacers. The gate stack is disposed between the gate spacers. The gate stack includes a high-κ dielectric layer and a gate electrode. The high-κ dielectric layer is disposed on the substrate and covers at least a portion of the semiconductor fin while leaving the sidewall of said at least one gate spacer uncovered. The gate electrode is disposed on the high-κ dielectric layer.

20 Claims, 11 Drawing Sheets

Related U.S. Application Data continuation of application No. 15/786,427, filed on Oct. 17, 2017, now Pat. No. 10,164,113, which is a continuation of application No. 14/925,680, filed on Oct. 28, 2015, now Pat. No. 9,793,406.

(51) Int. Cl.
*H01L 29/78* (2006.01)
*H01L 21/311* (2006.01)
*H01L 29/51* (2006.01)

(56) References Cited

U.S. PATENT DOCUMENTS

| | | |
|---|---|---|
| 2011/0147858 A1 | 6/2011 | Lim et al. |
| 2014/0110767 A1 | 4/2014 | Anderson et al. |
| 2014/0327055 A1 | 11/2014 | Wang et al. |
| 2015/0270177 A1 | 9/2015 | Tseng et al. |
| 2015/0311343 A1* | 10/2015 | Chowdhury ...... H01L 29/66545 257/401 |

* cited by examiner

SEMICONDUCTOR DEVICE AND MANUFACTURING METHOD THEREOF

PRIORITY

This application claims the benefit to and is a continuation of U.S. patent application Ser. No. 16/226,875, filed on Dec. 20, 2018, and entitled "Semiconductor Device and Manufacturing Method Thereof," now U.S. Pat. No. 10,510,897, which claims the benefit to and is a continuation of U.S. patent application Ser. No. 15/786,427, filed on Oct. 17, 2017, and entitled "Semiconductor Device and Manufacturing Method Thereof," now U.S. Pat. No. 10,164,113, which claims the benefit to and is a continuation of U.S. patent application Ser. No. 14/925,680, filed on Oct. 28, 2015, and entitled "Semiconductor Device and Manufacturing Method Thereof," now U.S. Pat. No. 9,793,406, each application is incorporated herein by reference.

BACKGROUND

As the semiconductor industry has progressed into nanometer technology process nodes in pursuit of higher device density, higher performance, and lower costs, challenges from both fabrication and design issues have resulted in the development of three dimensional designs, such as a fin-like field effect transistor (FinFET). A FinFET includes an extended semiconductor fin that is elevated above a substrate in a direction normal to the plane of the substrate. The channel of the FET is formed in this vertical fin. A gate is provided over (e.g., wrapping) the fin. The FinFETs further can reduce the short channel effect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A to 11A are top views of a method for manufacturing a semiconductor device at various stages in accordance with some embodiments of the presented disclosure.

FIGS. 1B to 11B are cross-sectional views respectively taking along line B-B of FIGS. 1A to 11A.

DETAILED DESCRIPTION

Figure 1A:
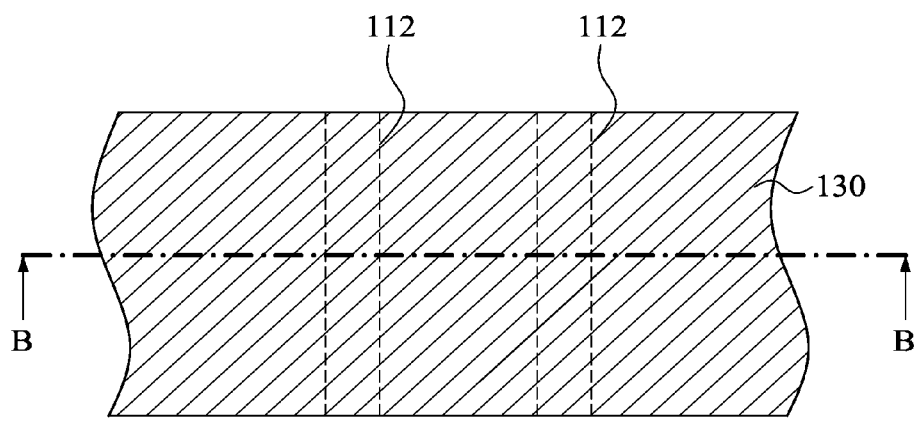

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the presented disclosure provide some improved methods for the formation of semiconductor devices and the resulting structures. These embodiments are discussed below in the context of forming finFET transistors having a single fin or multiple fins on a bulk silicon substrate. One of ordinary skill in the art will realize that embodiments of the presented disclosure may be used with other configurations.

Figure 1B:
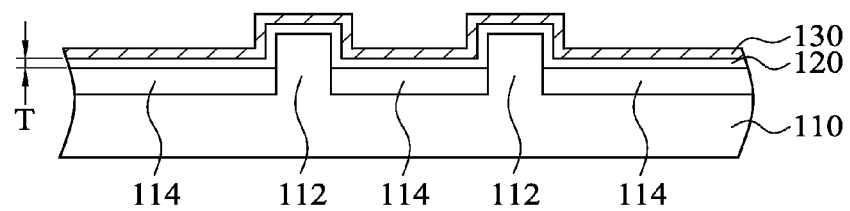

FIGS. 1A to 11A are top views of a method for manufacturing a semiconductor device at various stages in accordance with some embodiments of the presented disclosure, and FIGS. 1B to 11B are cross-sectional views respectively taking along line B-B of FIGS. 1A to 11A. Reference is made to FIGS. 1A and 1B. A substrate 110 is provided. The substrate 110 includes a plurality of semiconductor fins 112. In some embodiments, the semiconductor fins 112 include silicon. It is note that the number of the semiconductor fins 112 in FIGS. 1A and 1B is illustrative, and should not limit the claimed scope of the presented disclosure. A person having ordinary skill in the art may select suitable numbers for the semiconductor fins 112 according to actual situations.

In some embodiments, the substrate 110 may be a semiconductor material and may include known structures including a graded layer or a buried oxide, for example. In some embodiments, the substrate 110 includes bulk silicon that may be undoped or doped (e.g., p-type, n-type, or combinations thereof). For example, the doped substrate may be doped with p-type dopants, such as boron or $BF_2$; n-type dopants, such as phosphorus or arsenic; and/or combinations thereof. The doped substrate may be configured for an n-type FinFET, or alternatively configured for a p-type FinFET. Other materials that are suitable for semiconductor device formation may be used. Other materials, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide, or other semiconductor materials, such as quartz, sapphire, and glass could alternatively be used for the substrate 110. Alternatively, the substrate 110 may be an active layer of a semiconductor-on-insulator (SOI) substrate or a multi-layered structure such as a silicon-germanium layer formed on a bulk silicon layer.

The semiconductors fins 112 may be formed, for example, by patterning and etching the substrate 110 using photolithography techniques. In some embodiments, a layer of photoresist material (not shown) is deposited over the substrate 110. The layer of photoresist material is irradiated (exposed) in accordance with a desired pattern (the semiconductor fins 112 in this case) and developed to remove a portion of the photoresist material. The remaining photoresist material protects the underlying material from subsequent processing steps, such as etching. It should be noted that other masks, such as an oxide or silicon nitride mask, may also be used in the etching process.

In some other embodiments, the semiconductor fins 112 may be epitaxially grown to be strained for performance enhancement. For example, exposed portions of an underlying material, such as an exposed portion of the substrate 110, may be used in an epitaxial process to form the semiconductor fins 112. A mask may be used to control the shape of the semiconductor fins 112 during the epitaxial growth process.

In FIG. 1B, a plurality of isolation structures 114 are formed on the substrate 110 and adjacent to the semiconductor fins 112. The isolation structures 114, which act as shallow trench isolations (STIs) around the semiconductor fins 112, may be formed by chemical vapor deposition (CVD) techniques using tetra-ethyl-ortho-silicate (TEOS) and oxygen as a precursor. In some other embodiments, the STIs may be formed using processes such as reactive ion etch (RIE) of the substrate 110 to form trenches which are then filled with insulator material using deposition processes followed by chemical mechanical polishing (CMP) process. In some other embodiments, the isolation structures 114 may be formed by implanting ions, such as oxygen, nitrogen, carbon, or the like, into the substrate 110. The isolation structures 114 (so called as implant isolation regions) are formed by implanting an impurity to portions of the substrate 110, which portions surround active regions of the semiconductor fins 112 that are to be isolated. In yet some other embodiments, the isolation structures 114 are insulator layers of a SOI wafer.

CVD is a technique of thin solid film deposition on substrates from the vapor species through chemical reactions. The chemical reaction is one of distinctive features that CVD possesses compared with other film deposition techniques such as PVD. A tube-furnace CVD system for may include a gas delivery system, a reactor, and a gas removal system. During the CVD process, reactive gas species are fed into the reactor by the gas delivery system through valves. A gas-mixing unit may mix the various gases before they are let in the reactor. The reactor is where the chemical reaction takes place and the solid materials are deposited on substrates as the purpose of the reaction. The heaters are placed surrounding the reactor to provide high temperatures for the reaction. The by-products of the reaction and non-reacted gases are removed by the gas removal system.

In some embodiments, oxide liners (not shown) are optionally formed beneath the isolation structures 114. In some embodiments, the oxide liners may be thermal oxide having a thickness ranging from about 20 Angstroms to about 500 Angstroms. In some embodiments, the oxide liners may be formed using in-situ steam generation (ISSG) and the like. The formation of the oxide liners rounds corners of trenches of the isolation structures 114, which reduces the electrical fields, and hence may improve the performance of the resulting semiconductor device.

In FIG. 1B, a gate dielectric layer 120 is formed on the semiconductor fins 112 and the isolation structures 114. Therefore, the gate dielectric layer 120 covers the semiconductor fins 112. The gate dielectric layer 120, which prevents electron depletion, may include, for example, a dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. Some embodiments may include hafnium oxide ($HfO_2$) hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. The gate dielectric layer 120 may have a multilayer structure such as one layer of silicon oxide (e.g., interfacial layer) and another layer of dielectric material. The gate dielectric layer 120 may have a thickness T ranging from about 10 to about 30 Angstroms (Å). The gate dielectric layer 120 may be formed using CVD, physical vapor deposition (PVD), atomic layer deposition (ALD), thermal oxide, ozone oxidation, other suitable processes, or combinations thereof. In some embodiments, the gate dielectric layer 120 may include interfacial layer (not shown) to reduce damage between the gate dielectric layer 120 and the semiconductor fins 112 (i.e., channel region of the semiconductor device). The interfacial layer may include silicon oxide.

PVD is a deposition method which involves physical processes such as a plasma sputter bombardment rather than involving a chemical reaction at the surface. In the plasma sputter process, atoms or molecules are ejected from a target material by high-energy particle bombardment so that the ejected atoms or molecules can condense on a substrate as a thin film. ALD is a gas phase chemical process and it is a self-limiting atomic layer-by-layer growth method. The surface-controlled growth mechanism of ALD provides good step coverage and dense films with few (or no) pinholes. The precision achieved with ALD allows processing of thin films in a controlled way in the nanometer scale.

A high dielectric constant (high-κ) dielectric film 130 is formed above the substrate 110 and on the gate dielectric layer 120. In other words, the gate dielectric layer 120 is disposed between the high-κ dielectric film 130 and the substrate 110. Therefore, the high-κ dielectric film 130 covers the semiconductor fins 112. The high-κ dielectric film 130 has a dielectric constant (κ) higher than the dielectric constant of $SiO_2$, i.e. κ>3.9. The high-κ dielectric film 130 may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. The high-κ dielectric film 130 is deposited by suitable techniques, such as ALD, CVD, PVD, thermal oxidation, combinations thereof, or other suitable techniques.

Figure 2A:
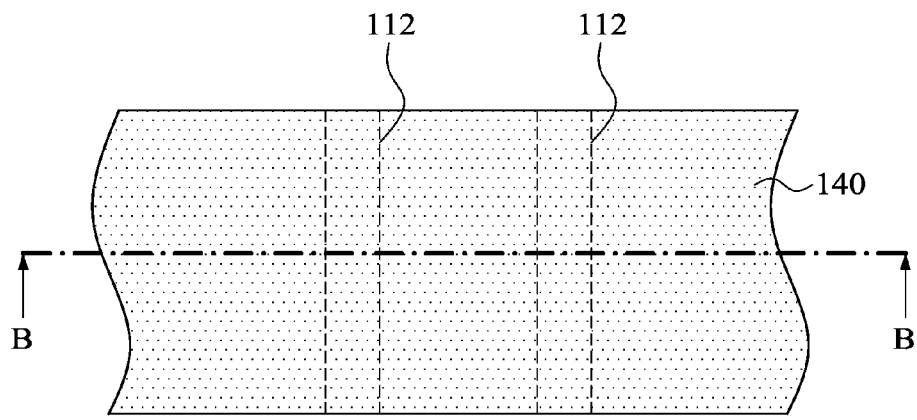
Figure 2B:
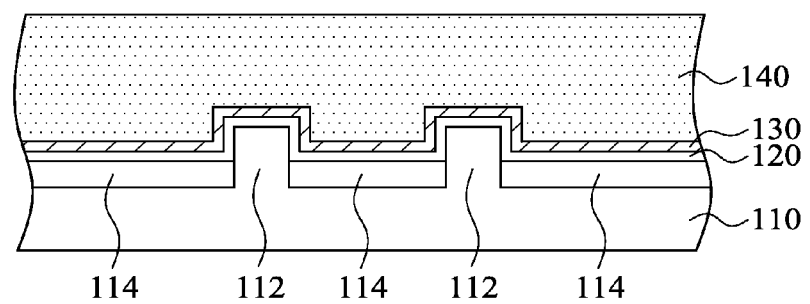

Reference is made to FIGS. 2A and 2B. A dummy layer 140 is formed above the substrate 110 to cover the high-κ dielectric film 130, the gate dielectric layer 120, and the semiconductor fins 112 of the substrate 110. In other words, the high-κ dielectric film 130 is disposed between the dummy layer 140 and the gate dielectric layer 120. In some embodiments, the dummy layer 140 includes a semiconductor material such as polysilicon, amorphous silicon, or the like. The dummy layer 140 may be deposited doped or undoped. For example, in some embodiments, the dummy layer 140 includes polysilicon deposited undoped by low-pressure chemical vapor deposition (LPCVD). For example, silane ($SiH_4$) may be used as a chemical gas in the CVD process to form the dummy layer 140. The polysilicon may also be deposited, for example, by furnace deposition of an in-situ doped polysilicon. Alternatively, the dummy layer 140 may includes other suitable materials.

Figure 3A:
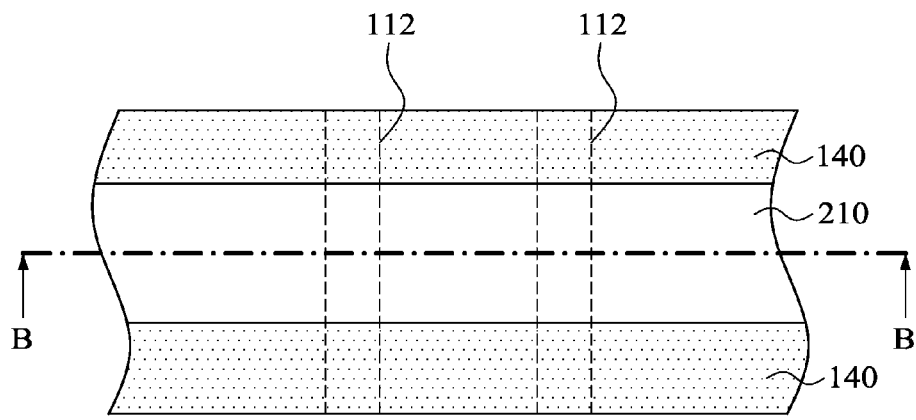
Figure 3B:
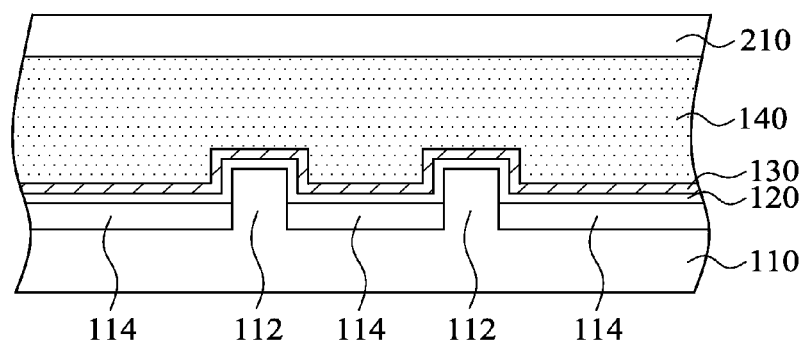

Reference is made to FIGS. 3A and 3B. A mask layer 210 is formed on the dummy layer 140 by suitable process(es) to a suitable thickness. The mask layer 210 covers a portion of the dummy layer 140 while leaves other portions of the dummy layer 140 uncovered. The mask layer 210, in some embodiments, is a hard mask layer which includes silicon oxide. The mask layer 210, in some other embodiments, may include silicon nitride (SiN), silicon oxynitride (SiON), silicon carbide (SiC), SiOC, spin-on glass (SOG), a low-κ film, tetraethylorthosilicate (TEOS), plasma enhanced CVD oxide (PE-oxide), high-aspect-ratio-process (HARP) formed oxide, amorphous carbon material, tetraethylorthosilicate (TEOS), other suitable materials, and/or combinations thereof. The silicon oxide layer may be formed using methods such as CVD, PVD, or ALD and may have a thickness ranging from about 100 Angstroms to about 500 Angstroms. In some other embodiments, the mask layer 210 may be a photo-resist layer. The photo-resist layer is deposited on the dummy layer 140, for example, by spin coating, and is used to form an intended pattern by way of irradiating, developing, drying, etching, and other suitable processes.

Figure 4A:
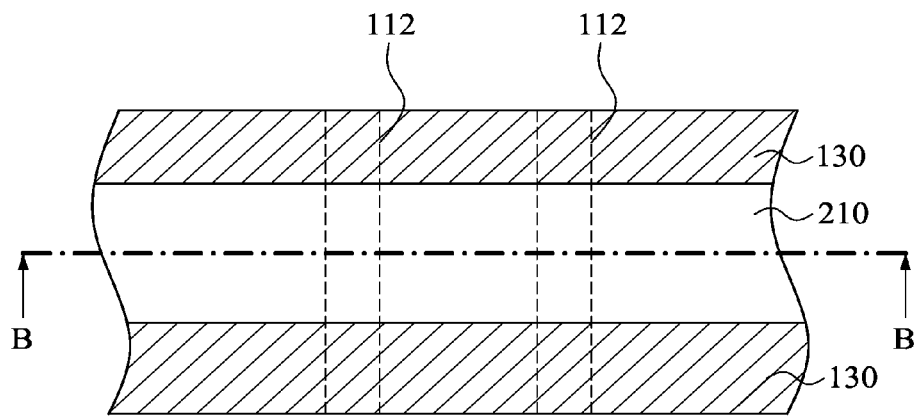
Figure 4B:
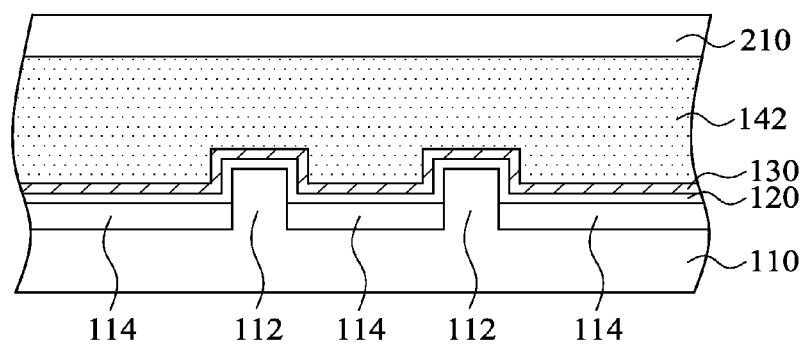

Reference is made to FIGS. 4A and 4B. A removing (or etch) process is performed to remove portions other than the intended pattern of the dummy layer 140 (see FIGS. 3A and 3B) (i.e., the portions uncovered by the mask layer 210) to form a dummy structure 142. Hence, portions of the high-κ dielectric film 130 are exposed (or uncovered) by the mask layer 210 and the dummy structure 142. In some embodiments, such an etch process may be performed multiple times. However, the patterning process is not limited to a photolithography process using photo-resists, and may be performed by an immersion lithography, electron beam lithography, or other suitable processes. As a result, the pattern of the dummy structure 142 as shown in FIGS. 4A and 4B is obtained.

Figure 5A:
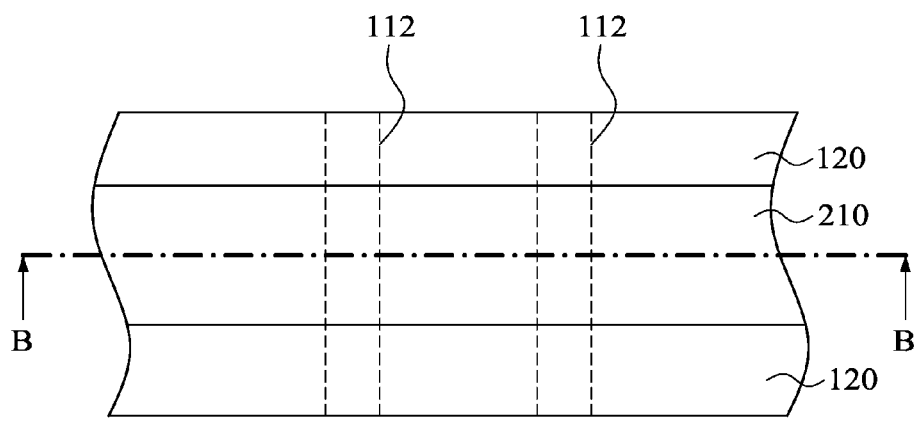
Figure 5B:
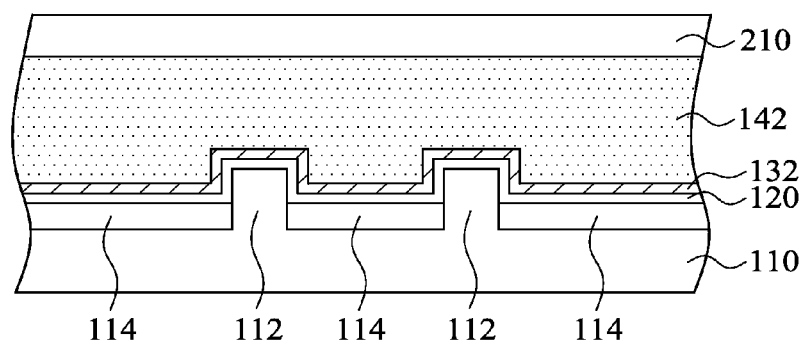

Reference is made to FIGS. 5A and 5B. Another removing (or etch) process is performed to remove portions other than the intended pattern of the high-κ dielectric film 130 (see FIGS. 4A and 4B) to form a high-κ dielectric layer 132. That is, the dummy structure 142 is as a mask to pattern the high-κ dielectric film 130. Hence, portions of the gate dielectric layer 120 are exposed (or uncovered) by the mask layer 210, the dummy structure 142, and the high-κ dielectric layer 132. In some embodiments, such an etch process may be performed multiple times. However, the patterning process is not limited to an immersion lithography, and may be performed by an electron beam lithography, or other suitable processes. As a result, the pattern of the high-κ dielectric layer 132 as shown in FIGS. 5A and 5B is obtained.

Figure 6A:
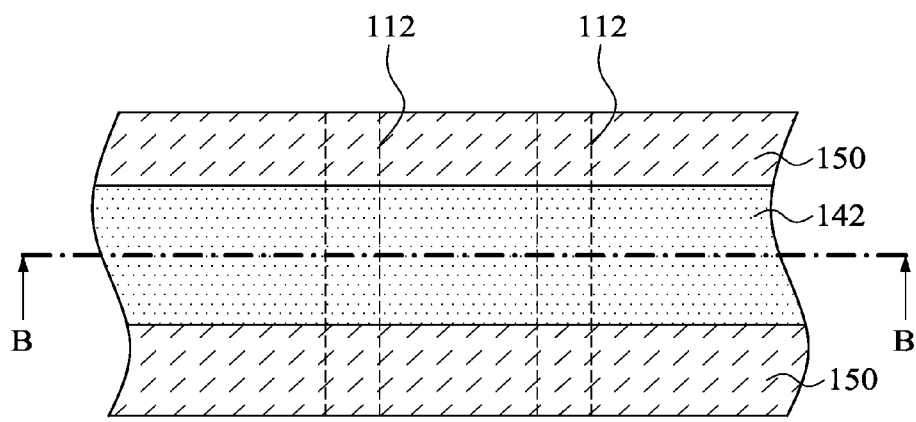
Figure 6B:
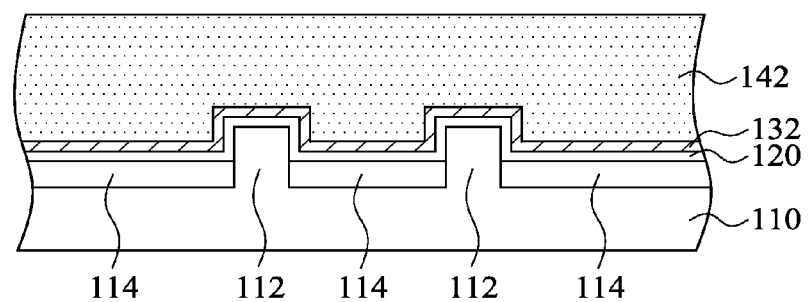

Reference is made to FIGS. 6A and 6B. A plurality of gate spacers 150 are formed on opposing sides of the dummy structure 142 and the high-κ dielectric layer 132. Therefore, the gate dielectric layer 120 is disposed between at least one of the gate spacers 150 and the substrate 100, and the gate spacers 150 are disposed on the portions of the gate dielectric layer 120 uncovered by the high-κ dielectric layer 132. That is, the gate spacers 150 are (directly) disposed on the gate dielectric layer 120. In some embodiments, at least one of the gate spacers 150 includes single or multiple layers. The gate spacers 150 can be formed by blanket depositing one or more dielectric layer(s) (not shown) on the previously formed structure. The dielectric layer(s) may include silicon nitride (SiN), oxynitride, silicon carbon (SiC), silicon oxynitride (SiON), oxide, and the like and may be formed by methods utilized to form such a layer, such as CVD, plasma enhanced CVD, sputter, and other methods known in the art. The gate spacers 150 may include different materials with different etch characteristics than the dummy layer 140 so that the gate spacers 150 may be used as masks for the patterning of the dummy structure 142 (described below with references to FIGS. 7A and 7B). The gate spacers 150 may then be patterned, such as by one or more etches to remove the portions of the gate spacers 150 from the horizontal surfaces of the structure.

Figure 7A:
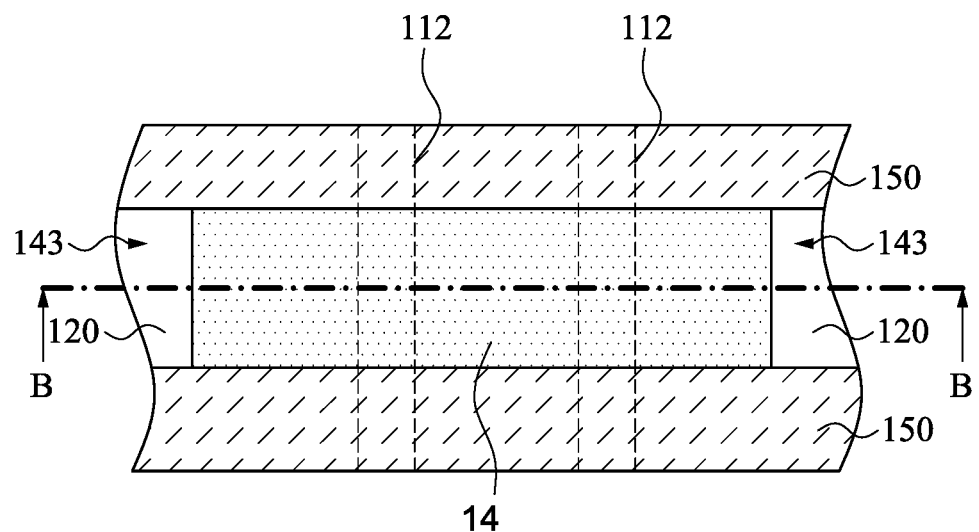
Figure 7B:
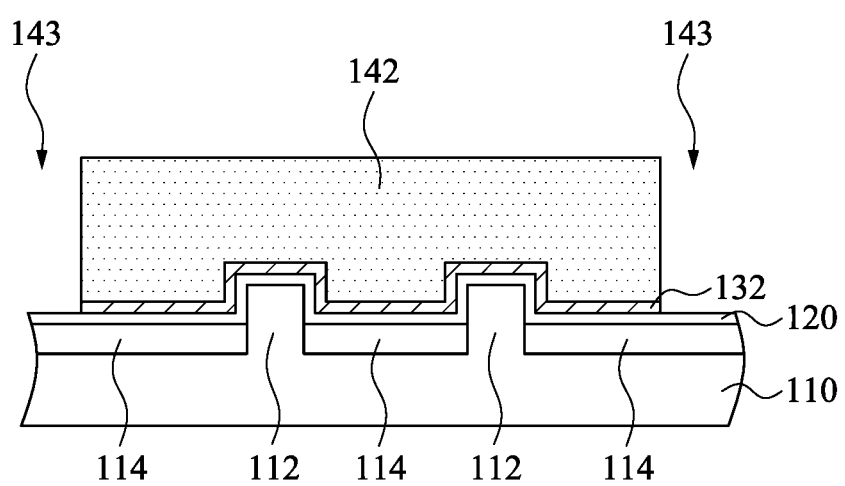

Reference is made to FIGS. 7A and 7B. Another mask layer (not shown) is formed over the dummy structure 142, the high-κ dielectric layer 132, and the semiconductor fins 112, such that the mask layer defines insulation areas between gate stacks 105 (see FIGS. 11A and 11B), i.e., to define the ends of the gate stacks 105. In some embodiments, the mask layer is a photoresist mask formed by depositing, exposing, and developing a layer of photoresist material. In some other embodiments, the mask layer may be a hard mask. The mask layer forms the insulation area between the gate stacks 105 in subsequent processing steps as discussed in greater detail below.

Subsequently, the dummy structure 142 and the high-κ dielectric layer 132 are partially removed (or patterned) in the regions exposed by the mask layer by an etching back process or other suitable process. For example, the dummy structure 142 and the high-κ dielectric layer 132 may be selectively etched thereby forming through holes 143 between the gate spacers 150 (see FIG. 7A) and adjacent to the dummy structure 142 and the high-κ dielectric layer 132 (see FIG. 7B). The dummy structure 142 and the high-κ dielectric layer 132 covers at least one of the semiconductor fins 112. For example, in FIGS. 7A and 7B, the dummy structure 142 and the high-κ dielectric layer 132 covers two of the semiconductor fins 112, and the claimed scope is not limited in this respect. The portion of the dummy structure 142 and the high-κ dielectric layer 132 exposed by the mask layer may be removed by a wet etch process that includes exposure to hydroxide containing solution (e.g., ammonium hydroxide), deionized water, and/or other suitable etchant solutions.

Figure 8A:
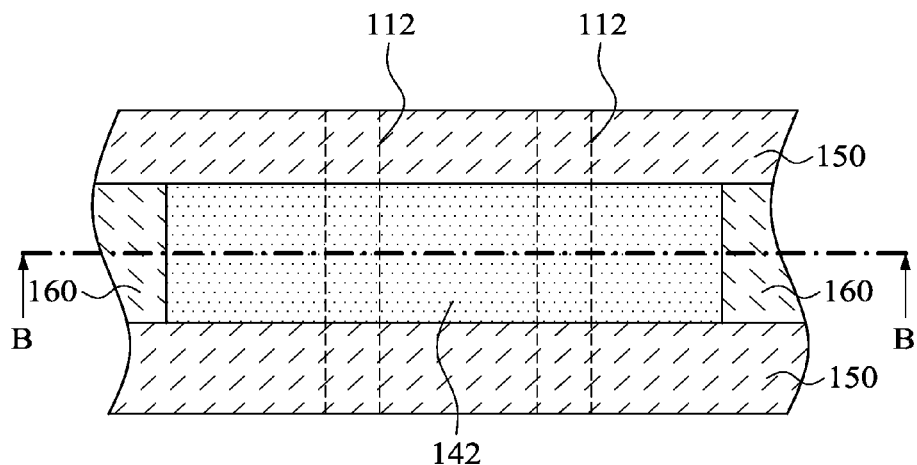
Figure 8B:
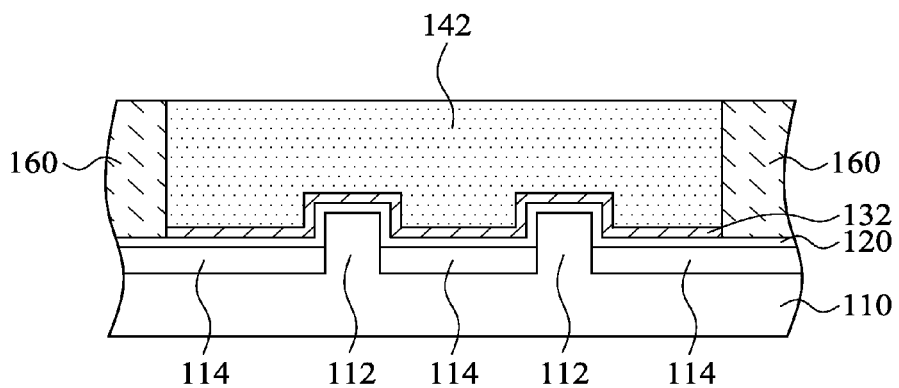

Reference is made to FIGS. 8A and 8B. The mask layer is removed by an ashing, stripping, or other suitable technique. Then, a plurality of insulating structures 160 are respectively disposed in the through holes 143 (see FIGS. 7A and 7B). The gate dielectric layer 120 is disposed between at least one of the insulating structures 160 and the substrate 110, and the insulating structures 160 are disposed on some other portions of the gate dielectric layer 120 uncovered by the high-κ dielectric layer 132. That is, the insulating structures 160 are (directly) disposed on the gate dielectric layer 120. The insulating structure 160 may be a plug. The dummy structure 142 and the high-κ dielectric layer 132 are surrounded by the gate spacers 150 and the insulating structures 160. In some embodiments, an interlayer dielectric (ILD) (not shown) is formed on the dummy structure 142 and in the through holes 143. A chemical mechanical planarization (CMP) process may then be performed to etch back and planarize the ILD to form the insulating structures 160. In some embodiments, the ILD is formed of an oxide such as phospho-silicate glass (PSG), boro-silicate glass (BSG), boron-doped phospho-silicate glass (BPSG), TEOS, or the like.

Figure 9A:
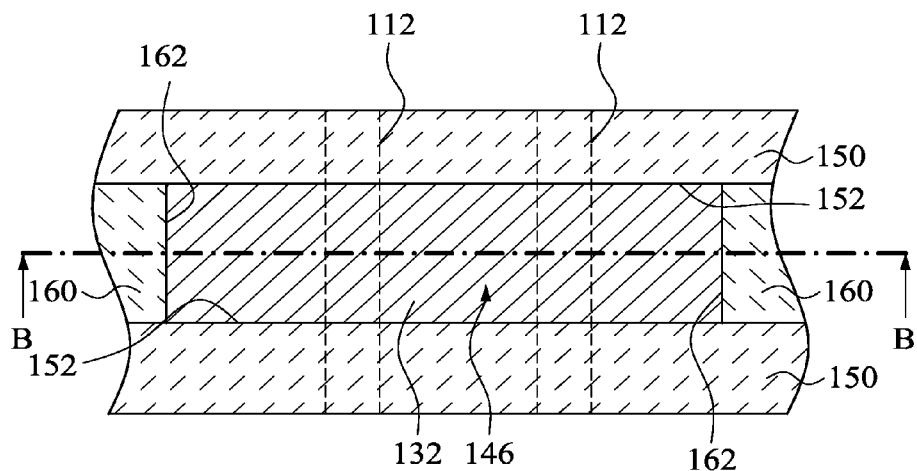
Figure 9B:
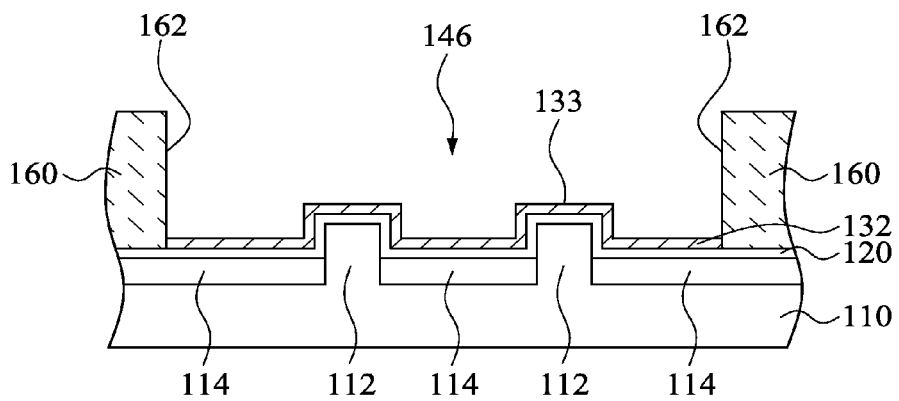

Reference is made to FIGS. 9A and 9B. The dummy structure 142 (see FIGS. 8A and 8B) is removed by an etching back process or other suitable process to form an opening 146 between the gate spacers 150 and the insulating structures 160. The opening 146 exposes the high-κ dielectric layer 132. At least one of the gate spacers 150 has a sidewall 152 facing the opening 146, and at least one of the insulating structures 160 has a sidewall 162 facing the opening 146. In other words, the opening 146 also expose the sidewalls 152 of the gate spacers 150 and the sidewalls 162 of the insulating structures 160, and the opening 146 has the sidewalls 152 and 162. Furthermore, the opening 146 has a bottom surface 133 (i.e., the top surface of the high-κ dielectric layer 132. The dummy structure 142 may be removed by a wet etch process that includes exposure to hydroxide containing solution (e.g., ammonium hydroxide), deionized water, and/or other suitable etchant solutions.

Figure 10A:
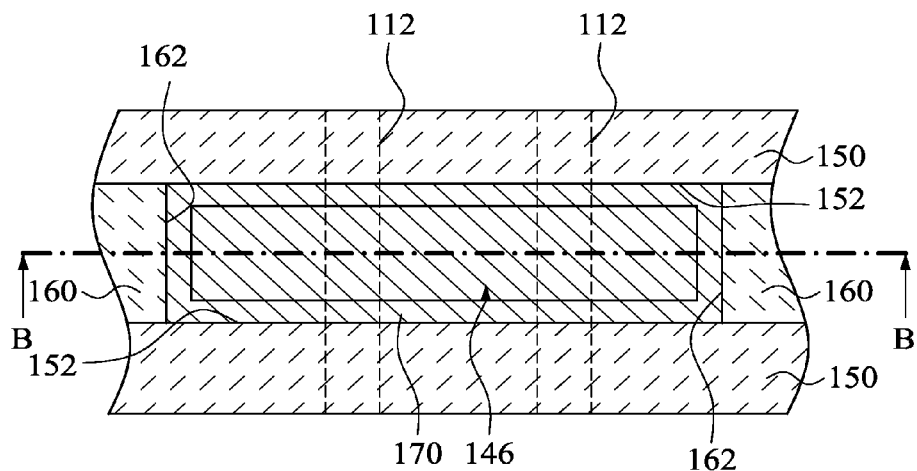
Figure 10B:
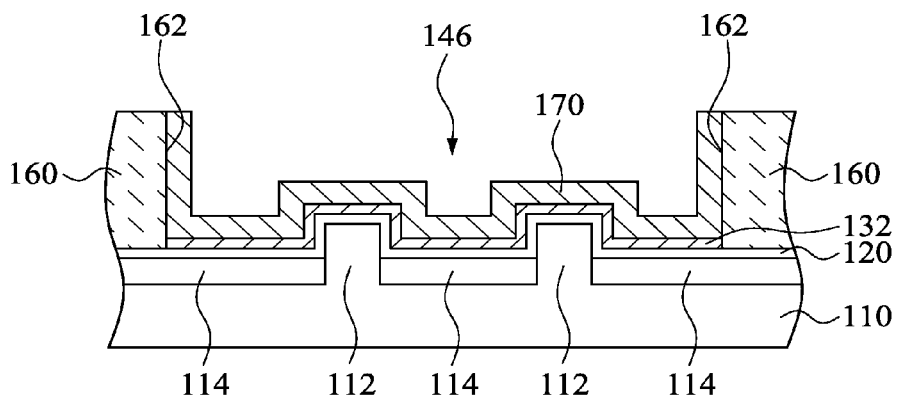

Reference is made to FIGS. 10A and 10B. A metal layer 170 is conformally formed in the openings 146 and on the high-κ dielectric layer 132. In other words, the metal layer 170 covers the high-κ dielectric layer 132. Therefore, the metal layer 170 attaches to the sidewalls 152 of the gate spacers 150 and the sidewalls 162 of the insulating structures 160. The metal layer 170 may be a work-function (WF) metal layer. In some embodiments, the WF metal layer can include impurities. For example, the impurity used in providing an N-type work-function shift is an element from the Lanthanide group. Examples of WF metal layers that may be deposited include P-type metal materials and N-type metal materials. Examples of P-type WF metal layer may include, but not limited to, Re, Fe, Ru, Co, Rh, Ir, Ni, Pd, and Pt. Pd can be used as an impurity in a P-type WF layer. The metal layer 170 may be formed by depositing WF metal materials in the opening 146. The metal layer 170 may include a single layer or multi layers, such as a WF layer, a liner layer, a wetting layer, and an adhesion layer. The metal layer 170 may include Ti, TiAlN, TaC, TaCN, TaSiN, Mn, Zr, TiN, TaN, Ru, Mo, WN, or any suitable materials. The metal layer 170 may be formed by ALD, PVD, CVD, or other suitable process.

Figure 11A:
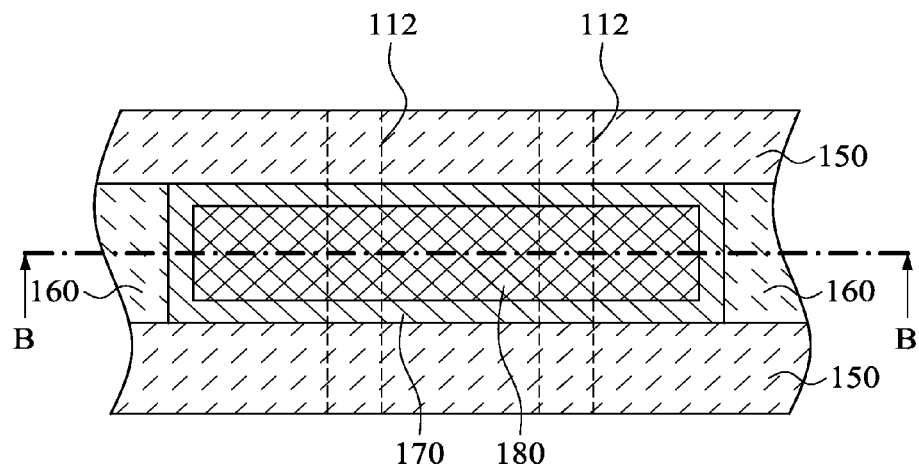
Figure 11B:
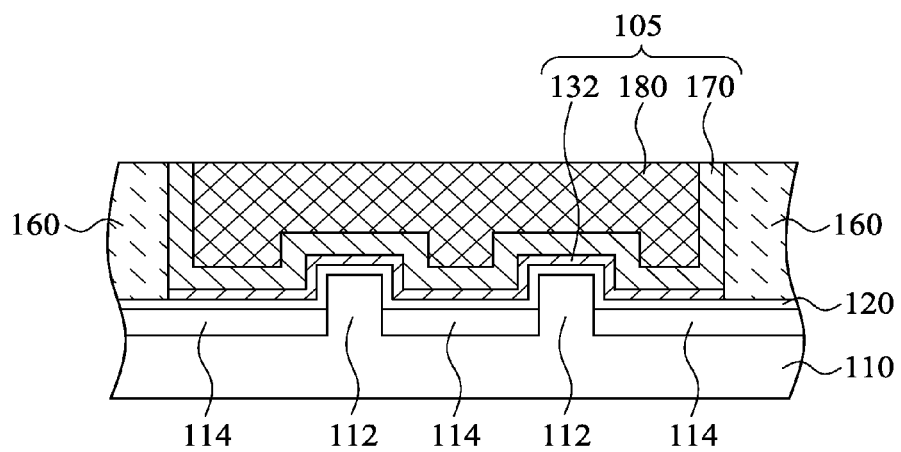

Reference is made to FIGS. 11A and 11B. A gate electrode 180 is formed on the metal layer 170 and fills the opening 146. The gate electrode 180 may include aluminum (Al), copper (Cu), AlCu, tungsten (W), titanium (Ti), titanium nitride (TiN), tantalum (Ta), tantalum nitride (TaN), cobalt (Co), copper (Cu), nickel (Ni), combinations thereof, and/or other suitable conductive materials. The gate electrode 180 is deposited by ALD, PVD, CVD, plating, or other suitable process. With the gate electrode 180, the metal layer 170, and the high-κ dielectric layer 132, a gate stack 105 is formed. In some embodiments, a CMP process is applied to remove excessive the gate electrode 180 to provide a substantially planar top surface for the gate stack 105, the insulating structures 160, and the gate spacers 150. Hence, the gate stack 105 and at least one of the semiconductor fins 112 can form a fin field effect transistor (finFET). The process from FIGS. 9A to 11B is referred as a replacement gate loop process. Furthermore, if the dummy structure 142 of FIGS. 8A and 8B is made of polysilicon, the process from FIGS. 9A to 11B is referred as a replacement polysilicon gate (RPG) loop process. That is, the dummy polysilicon layer is removed and then at least one metal layer (or metal gate layer) is filled into the opening 146 for a transistor of the semiconductor device.

According to the aforementioned embodiments, the gate stack is disposed between two adjacent insulating structures, such that the gate stack can be isolated from other gate stacks. Since the formation of the high-κ dielectric layer is performed before the formation of the insulating structures and the gate spacers, the high-κ dielectric layer leaves the sidewalls of the insulating structures and the gate spacers uncovered. Hence, the aperture of the opening defined by the insulating structures and the gate spacers is enlarged. Therefore, the deposition window of the metal layer and the gate electrode is enlarged, reducing the probability of formation of void in the opening. With this configuration, the voltage performance of the gate stack can be improved.

According to some embodiments, a semiconductor device includes a substrate, at least two gate spacers, and a gate stack. The substrate has at least one semiconductor fin. The gate spacers are disposed on the substrate. At least one of the gate spacers has a sidewall facing another of the gate spacers. The gate stack is disposed between the gate spacers. The gate stack includes a high-κ dielectric layer and a gate electrode. The high-κ dielectric layer is disposed on the substrate and covers at least a portion of the semiconductor fin while leaving the sidewall of said at least one gate spacer uncovered. The gate electrode is disposed on the high-κ dielectric layer.

According to some embodiments, a semiconductor device includes a substrate, at least two gate spacers, at least two insulating structures, and a gate stack. The substrate has at least one semiconductor fin. The gate spacers are disposed on the substrate. The insulating structures are disposed between the two gate spacers. The insulating structures and the gate spacers together define an opening therebetween. The opening has a bottom surface and at least one sidewall. The gate stack is disposed in the opening, and the gate stack includes a high-κ dielectric layer and a gate electrode. The high-κ dielectric layer covers the bottom surface of the opening while leaves the sidewall of the opening uncovered. The gate electrode is disposed on the high-κ dielectric layer.

According to some embodiments, a method for manufacturing a semiconductor device includes forming a high-κ dielectric film on a substrate. The substrate has at least one semiconductor fin. A dummy layer is formed on the high-k dielectric film. The dummy layer and the high-κ dielectric film are patterned to form a dummy structure and a high-κ dielectric layer. At least two gate spacers are formed on opposite sides of the dummy structure and the high-κ dielectric layer. The dummy structure is removed to form an opening. A gate electrode is formed in the opening.

One general aspect includes a semiconductor device, including: a substrate having at least one semiconductor fin; a region defined by gate spacers formed on the gate insulating film on two opposed sides of the region and insulating structures formed on the gate insulating film on two other opposed sides of the region; and a high-k dielectric layer within the region and being co-terminus with the region.

One general aspect includes a semiconductor device, including: a gate stack formed over a substrate, the gate stack including a gate dielectric and a gate electrode; a first gate spacer lining a first sidewall of the gate stack and a second gate spacer lining a second sidewall of the gate stack, the second sidewall being opposed the first sidewall; a first insulating structure lining a third sidewall of the gate stack, the third sidewall connecting the first sidewall and the second sidewall, and a second insulating structure lining a fourth sidewall of the gate stack, the fourth sidewall being opposed the third sidewall; and a continuous insulating film extending under and contacting the gate stack, the first and second gate spacers and the first and second insulating structures.

One general aspect includes a method including: forming a first dielectric layer on a substrate, forming a second dielectric layer on the first dielectric layer, forming a dummy layer on the second dielectric layer, patterning the dummy layer and the second dielectric layer to form a dummy structure having a first sidewall and an opposing second sidewall, forming spacers on the first sidewall and opposing second sidewall, patterning the dummy structure to form a dummy stack having a first end and an opposing second end, forming insulating structures on the first end and the opposing second end, removing the dummy stack, and forming a gate structure between the spacers and between the insulating structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a gate stack over a fin, the gate stack including one or more metal layers;
first insulating structures over the fin on opposing first sides of the gate stack; and
second insulating structures on opposing second sides of the gate stack, wherein the second insulating structures are interposed between the first insulating structures, wherein the opposing first sides of the gate stack are free of the second insulating structures, wherein an upper surface of the first insulating structures is level with an upper surface of the second insulating structures.

2. The device of claim 1, wherein the gate stack further comprises:
a high-k dielectric layer interposed between the one or more metal layers and the fin, wherein a lower surface of the high-k dielectric layer is level with a bottom surface of the first insulating structures.

3. The device of claim 2, wherein the bottom surface of the high-k dielectric layer is level with a bottom surface of the second insulating structures.

4. The device of claim 1, wherein the gate stack comprises a first metal layer, wherein the first metal layer is in direct contact with the second insulating structures.

5. The device of claim 4, wherein the first metal layer is in direct contact with the first insulating structures.

6. The device of claim 1, wherein the first insulating structures comprise silicon nitride, oxynitride, silicon carbon, or silicon oxynitride.

7. The device of claim 6, wherein the second insulating structures comprise phospho-silicate glass (PSG), borosilicate glass (BSG), or boron-doped phospho-silicate glass (BPSG).

8. A semiconductor device, comprising:
a gate electrode over a fin, the gate electrode having a first longitudinal axis, the fin having a second longitudinal axis, the first longitudinal axis intersecting the second longitudinal axis;
a first insulating structure and a second insulating structure over the fin and on opposing sides of the gate electrode;
a third insulating structure and a fourth insulating structure along the first longitudinal axis, wherein the third insulating structure and the fourth insulating structure are interposed between the first insulating structure and the second insulating structure; and
a gate dielectric layer interposed between the gate electrode and the fin, wherein the gate dielectric layer extends below the third insulating structure and the fourth insulating structure.

9. The device of claim 8, wherein the gate dielectric layer extends between the fin and the first insulating structure and between the fin and the second insulating structure.

10. The device of claim 8 further comprising:
a first dielectric layer over the fin; and
a second dielectric layer over the first dielectric layer, wherein the gate electrode is over the second dielectric layer.

11. The device of claim 10, wherein the third and fourth insulating structures extend along sidewalls of the second dielectric layer along the first longitudinal axis.

12. The device of claim 11, wherein the first and second insulating structures extend along sidewalls of the second dielectric layer along the second longitudinal axis.

13. The device of claim 8, wherein a sidewall of the third insulating structure is aligned with a sidewall of the gate electrode.

14. The device of claim 8, wherein the third insulating structure is not connected to the fourth insulating structure.

15. A semiconductor device, comprising:
a fin;
isolation region along opposing sides of the fin, the fin protruding above the isolation region;
a gate stack over the fin and the isolation region, the gate stack including a gate electrode; and
a first insulator over the fin, the first insulator lining a first sidewall of the gate electrode;
a second insulator over the fin, the second insulator lining a second sidewall of the gate electrode;
a third insulator over the isolation region, the third insulator lining and directly contacting a third sidewall of the gate electrode; and
a fourth insulator over the isolation region, the fourth insulator lining and directly contacting a fourth sidewall of the gate electrode.

16. The device of claim 15 further comprising a first dielectric layer and a second dielectric layer over the first dielectric layer, the first dielectric layer and the second dielectric layer being interposed between the gate electrode and the fin, wherein the first dielectric layer separates the third insulator and the fourth insulator from the isolation region.

17. The device of claim 16, wherein the first insulator directly contacts the first dielectric layer and the second dielectric layer.

18. The device of claim 17, wherein the third insulator directly contacts the first dielectric layer and the second dielectric layer.

19. The device of claim 15, wherein the third insulator directly contacts the first insulator and the second insulator.

20. The device of claim 15, wherein the gate electrode comprises a first metal layer and a second metal layer, wherein the first metal layer completely separates the second metal layer from the first insulator, the second insulator, the third insulator, and the fourth insulator.

* * * * *